United States Patent
Struempfel et al.

(10) Patent No.: US 8,033,781 B2
(45) Date of Patent: Oct. 11, 2011

(54) METHOD FOR LOADING AND UNLOADING A TRANSPORT DEVICE

(75) Inventors: Johannes Struempfel, Dresden (DE); Reinhardt Bauer, Dresden (DE); Andrewas Heisig, Dresden (DE); Hans-Christian Hecht, Weinboehla (DE); Hartmut Freitag, Dresden (DE); Heiko Richter, Pesterwitz (DE); Andre Ulbricht, Dresden (DE); Falk Schwerdtfeger, Dresden (DE)

(73) Assignee: Von Ardenne Anlagentechnik GmbH, Dresden (DE)

( * ) Notice: Subject to any disclaimer, the term of this patent is extended or adjusted under 35 U.S.C. 154(b) by 0 days.

(21) Appl. No.: 12/730,683

(22) Filed: Mar. 24, 2010

(65) Prior Publication Data

US 2010/0178151 A1 Jul. 15, 2010

Related U.S. Application Data

(62) Division of application No. 11/870,014, filed on Oct. 10, 2007.

(30) Foreign Application Priority Data

Oct. 10, 2006 (DE) .................. 10 2006 048 160

(51) Int. Cl.
*B65G 47/34* (2006.01)
(52) U.S. Cl. .................... 414/816; 294/87.28; 118/730
(58) Field of Classification Search .............. 198/487.1, 198/803.12; 294/87.1, 87.28; 414/431, 623, 414/671, 746.5, 746.8, 910, 757, 816
See application file for complete search history.

(56) References Cited

U.S. PATENT DOCUMENTS

| | | | | |
|---|---|---|---|---|
| 2,998,892 A | * | 9/1961 | Menzel et al. | 414/623 |
| 3,874,525 A | | 4/1975 | Hassan | |
| 4,074,422 A | | 2/1978 | Borjesson | |
| 4,192,253 A | * | 3/1980 | Aichert et al. | 118/712 |
| 4,606,891 A | | 8/1986 | Murphy, Jr. | |
| 4,797,248 A | * | 1/1989 | Tsitsichvili | 376/261 |
| 5,032,052 A | * | 7/1991 | Swain | 414/222.03 |
| 5,433,572 A | * | 7/1995 | Swain et al. | 414/27 |
| 7,744,139 B1 | * | 6/2010 | Kalisch et al. | 294/87.1 |

FOREIGN PATENT DOCUMENTS

DE 197 15 151 10/1998
GB 2203404 A * 10/1988

* cited by examiner

*Primary Examiner* — James Keenan
(74) *Attorney, Agent, or Firm* — Heslin Rothenberg Farley & Mesiti P.C.

(57) ABSTRACT

A transport device for transporting elongated substrates through a vacuum coating system comprises an essentially rectangular frame and two groups of holding elements, which are rotatably mounted on opposite sides of the frame in such a manner that any pair of opposite holding elements can be connected to both ends of a substrate. Furthermore, at least one retainer bar is provided that is operatively connected to a group of holding elements in such a manner that the holding elements of this group are moveable in order to increase or decrease by choice their distance from the holding elements of the other group. Also provided are a loading and unloading device for loading and unloading the transport device, and a method for loading and unloading the transport device.

5 Claims, 5 Drawing Sheets

Figure 1A:
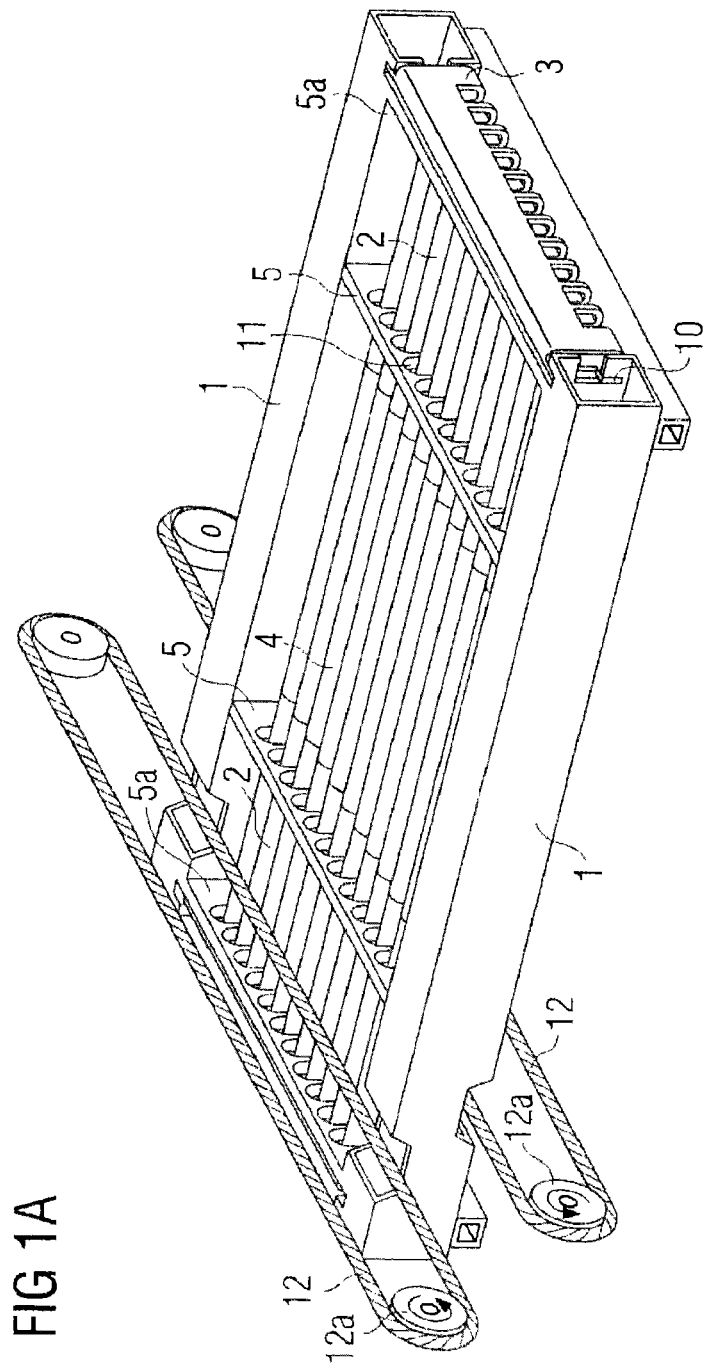

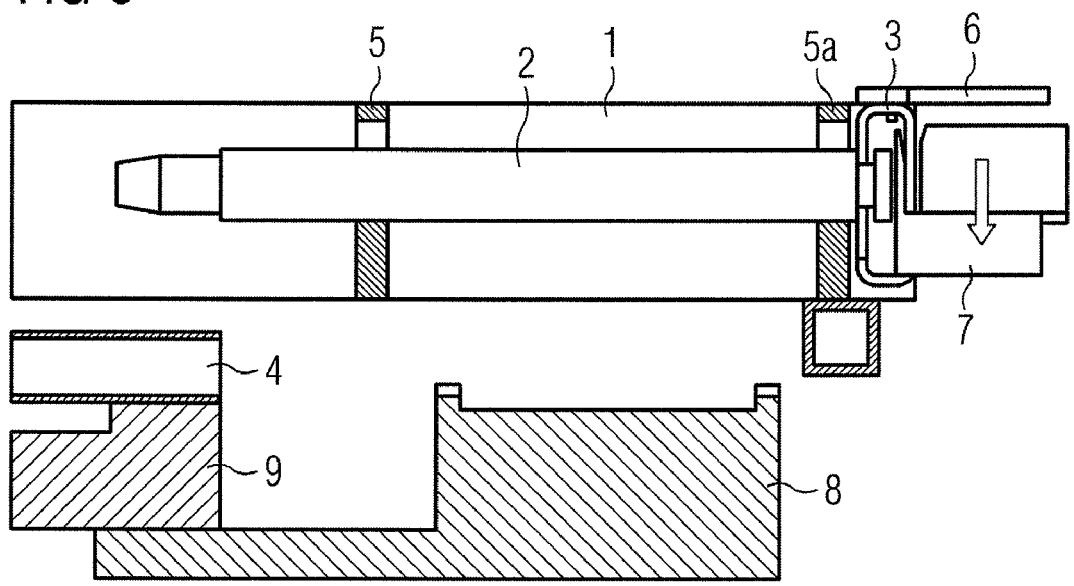
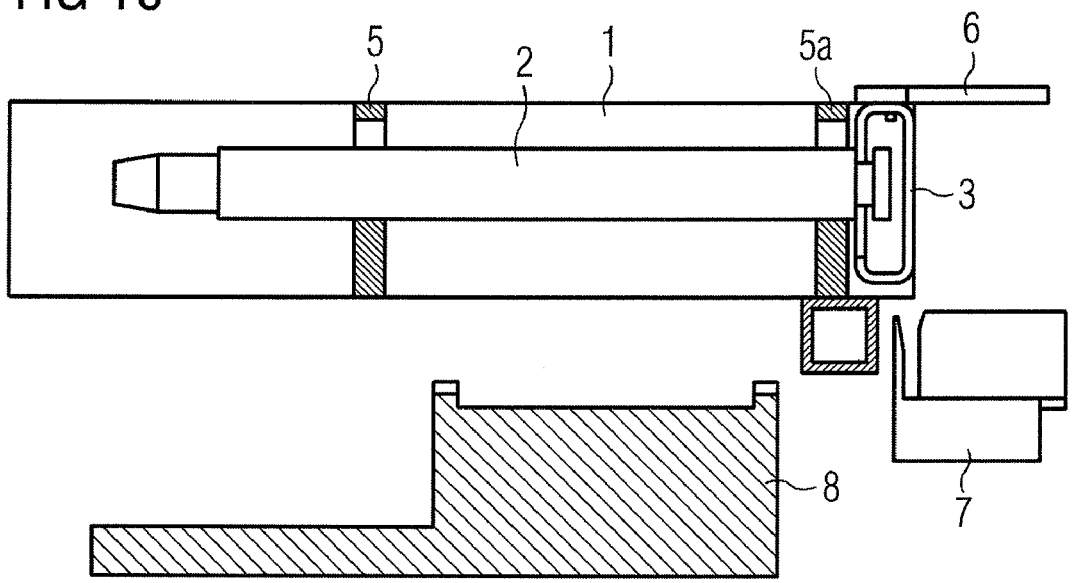

METHOD FOR LOADING AND UNLOADING A TRANSPORT DEVICE

CROSS-REFERENCE TO RELATED APPLICATIONS

This application is a division of U.S. application Ser. No. 11/870,014 filed on Oct. 10, 2007, which claims priority of German Application DE 10 2006 048 160.7 filed on Oct. 10, 2006, the entire contents of these applications being hereby incorporated by reference herein.

BACKGROUND ART

The invention relates to a transport device for elongated substrates, a loading and unloading device and a method for loading and unloading the transport device.

The German patent application 10 2006 031 826.9, the entire content of which is incorporated in the present application by reference, discloses a transport device (carrier) for transporting elongated substrates through a vacuum coating system, which comprises an essentially rectangular frame, which is designed for rotationally positioning holding elements (for example, so-called inserts). The holding elements are configured in such a manner that they can be connected to one respective end of an elongated substrate. The substrates with the holding elements, which are arranged on the ends of said substrates, are disposed in the carrier in such a manner that the ends of the two holding elements are rotatably mounted on the opposite sides of the frame.

A first subject matter of the present application is an improvement of the above-described transport device. Another subject matter of the application relates to a loading and unloading device for loading and unloading the transport device. Still another subject matter of the application relates to a method for loading and unloading the transport device.

BRIEF SUMMARY OF THE INVENTION

The transport device according to the invention for transporting elongated substrates through a vacuum coating system comprises an essentially rectangular frame and two groups of holding elements, which are rotatably mounted on opposite sides of the frame in such a manner that any pair of opposite holding elements can be connected to both ends of a substrate. Furthermore, at least one retainer bar is provided that is operatively connected to a group of holding elements in such a manner that the holding elements of this group are moveable in order to increase or decrease by choice their distance from the holding elements of the other group.

The transport device may be used for coating elongated substrates in a vacuum coating system and makes it possible to simultaneously exchange all of the substrates that are held in the transport device. In this way the exchange of substrates can be automated; and the time required for said exchange is significantly decreased. At the same time a fouling of the substrates is avoided. Horizontal arrangements of the transport device in the vacuum coating system are just as possible as vertical arrangements, where the substrates are transported in an upright manner through the vacuum coating system.

The frame may be made, for example, with interconnected longitudinal and transverse bars, the information "longitudinal" and "transverse" referring to the position of the respective bar in relation to the arrangement of the elongated substrates inside the transport device. Correspondingly, a longitudinal bar is a frame element, which is oriented parallel to the elongated substrates, whereas a transverse bar is arranged orthogonal thereto. As explained below, it is expedient to arrange the transport device inside a vacuum coating system in such a manner that the frame elements, which are referred to here as the longitudinal bars, are oriented at right angles to the direction of transport. That is, the transverse bars are arranged parallel to the transport direction of the substrates. Both the longitudinal bars and also the transverse bars may be made, for example, from a rectangular hollow profile.

The holding elements may be configured, for example, as rotationally symmetrical components. One end of the holding element may be configured conically so that it can mate with the end of the tubular substrate (so-called insert). In order to produce the operative connection with the retainer bar, the other end of such an insert can exhibit, for example, a peripheral groove, with which the retainer bar engages and which enables the transfer of a force, which acts in the longitudinal direction of the insert, in order to move the insert of one group in this direction in order to increase or decrease its distance from the opposite insert of the other group. If, for example, ceramic is chosen as the material for the inserts, then they can be manufactured at a low cost and without maintenance and are suitable for use at high temperatures. Other designs of the holding elements, which are configured so that they can connect with one end of an elongated substrate, are just as possible and are, therefore, regarded as included in the claimed subject matter.

Another design of the transport device can provide one retainer bar for each group of holding elements so that both groups of holding elements can be moved simultaneously or in succession independently of each other.

Furthermore, it can be provided that each retainer bar can be releasably connected to the frame, so that the position of the holding elements is secured against unintentional displacements, when the transport device is populated with the substrates. The releasable connection of the retainer bar can be configured, for example, in such a manner that the retainer bar can be releasably connected to a transverse bar of the frame. Of course, the releasable connection of the retainer bar may also be realized with the same effect for the longitudinal bar(s) and is, therefore, included in the technical teaching that is claimed.

In another embodiment of the transport device the retainer bar and the frame exhibit complementary connecting means, which can be selectively connected or released through a movement of the retainer bar in relation to the frame in the normal direction of the plane, which is formed by the frame. In this design the retainer bar is then moved at right angles to the longitudinal direction of the substrate, in order to release the interlocking with the frame and then to move the retainer bar in the plane of the frame, in order to release the substrates from the holding elements. However, the same effect can be achieved with the connecting means, which can be selectively connected or released through a movement of the retainer bar in relation to the frame in the plane, formed by the frame. Therefore, such designs are regarded as included in the transport device that is claimed.

The holding elements may be mounted, for example, in openings, which are provided for them in the transverse bars of the frame. A rotationally symmetrical holding element of the above-described type may be mounted in a central region without any additional mounting mechanisms in one transverse bar or in a plurality of transverse bars. That means that the central region of the holding element and the opening of the transverse bar(s) form the mounting of the holding element in the frame. If, for example, each side of the frame exhibits two parallel running transverse bars, each of which exhibits one opening for each holding element, an especially stable mounting of the holding element is achieved, since the holding element is actively prevented from tilting owing to the simultaneous mounting in two transverse bars. The mounting of the holding elements in openings of the transverse bar without any additional mounting mechanisms is maintenance-free, can be produced at a low cost and is suitable for the use of the transport device at high temperatures.

In order to coat elongated, for example tubular, substrates uniformly and on all sides, at least one drive mechanism for rotating the holding elements may also be provided. The drive mechanism may comprise, for example, a drivable cable, which is operatively connected to the holding elements in such a manner that the friction between the moving cable and the holding elements sets the holding elements rotating. The cable may be driven, for example, by means of an electric motor. As already explained above, in particular in the event that the substrates are to be rotated during the coating process, it is practical to arrange the transport device in the vacuum coating system in such a manner that the transverse bars of the transport device are arranged parallel to the transport direction of the substrates.

The connection between the frame and the retainer bar may be configured, for example, in such a manner that it may be conjoined by moving the retainer bar in relation to the frame in the normal direction of the plane, formed by the longitudinal and the transverse bars, and may be released in the opposite direction. Thus, it is possible to release from the frame the retainer bar of a transport device of the described type that is arranged horizontally in a vacuum coating system by lifting and to connect to the frame by lowering.

The transport device according to the invention enables a simple and automatic loading and unloading of the frame with elongated substrates. To this end, a method is proposed below that can be carried out in an especially advantageous manner when used with the loading and unloading device that is also described below.

The method according to the invention for loading and unloading the transport device with elongated substrates comprises the following steps:
1. releasing the connection between the retainer bar and the frame,
2. moving the retainer bar and the group of holding elements that are connected to said retainer bar, in order to increase the distance from the other group of holding elements, until the holding elements are released from the elongated substrates,
3. removing the exposed elongated substrates,
4. inserting a new batch of elongated substrates,
5. moving the retainer bar and the group of holding elements that are connected to said retainer bar, in order to decrease the distance from the other group of holding elements, until the holding elements are connected with the elongated substrates,
6. producing the connection between the retainer bar and the frame.

When the retainer bar(s) and the frame are connected by a movement in relation to the normal direction of the plane, formed by the frame, steps 1 and 6 of the above-described method mean that such a movement in relation to the respective correct direction is carried out. For example, in a horizontally arranged transport device this can mean that the retainer bar(s) is/are lifted, whereas the frame retains its position. In contrast, the technical teaching that is claimed also includes embodiments of the method, wherein the frame is lifted, whereas the retainer bar retains its position or the retainer bars retain their position.

It may be provided in an advantageous manner that prior to the second step (that is, before moving the retainer bar in the outward direction in order to increase the distance between the two groups of holding elements), a storage device (tray) is moved into a position below the frame, so that the substrates are deposited on the storage device. If the connection between the retainer bar and the frame is released, as described above, by lifting the retainer bar, then it is advantageous to also lift the storage device, so that the substrates are received directly and do not fall onto the storage device. If a storage device is provided, it can be provided in an advantageous manner that the third step (that is, the removal of the exposed substrates) consists of lowering the storage device and removing it from its position below the frame.

Similarly, the fourth step (that is, the insertion of a new batch of substrates) may consist of moving a substrate-populated storage device into a position below the frame and optionally lifting; and according to the fifth step (that is, after moving the retainer bar in the inward direction, in order to decrease the distance between both groups of holding elements), it may be provided that the storage device is lowered and moved away from its position below the frame.

In order to carry out this method, a loading and unloading device is proposed that comprises at least one manipulator with a drive mechanism for carrying out steps 2 and 5 (that is, for moving the retainer bar in the inward and outward direction). It can be provided in an advantageous manner that the manipulator is designed in such a manner that it can also be moved in the normal direction of the plane, formed by the frame. Thus, it is possible to produce the connection between the retainer bar and the frame in cases in which to this end a relative movement in the normal direction is necessary. For example, the manipulator may be designed as a gripper claw, which can be moved in the necessary directions.

It has proven to be advantageous to embody the manipulator as an operator fork, which reaches into the retainer bar openings that are provided for said fork and lifts said retainer bar. Furthermore, it can be provided in an advantageous manner that the manipulator also comprises a holding down device. The holding down device can be arranged in such a manner that it interacts with the operator fork, thus forming a gripper claw. Then the holding down device holds the retainer bar in position until the operator fork has reached into the retainer bar openings that are provided for said fork; and then together with the operator fork, the retainer bar executes the inward or outward movement of the retainer bar as well as optionally the lift movement.

The manipulator is the core element of the claimed loading and unloading device. With its aid the basic functions of the method according to the invention are implemented, namely the connecting and releasing of the retainer bar from the frame as well as the connecting and releasing of the holding elements from the elongated substrates.

As another advantage, the loading and unloading device may exhibit a lifting device, which may be configured, for example, in such a manner that it serves a dual purpose. On the one hand, the lifting device can serve to position the storage device. That is, it can be used to move the storage device into a position below the frame or to move the storage device out from underneath said frame and/or to lift and lower the storage device. On the other hand, the lifting device may serve simultaneously to support the free ends of the holding elements, whereas the retainer bar and the holding elements that are connected to said bar are moved outwards or remain in the outward position. The lifting device makes sure that, on the one hand, the holding elements are guided and, on the other hand, are not damaged during the inward or outward movement of the retainer bar.

BRIEF SUMMARY OF THE DRAWING FIGURES

The invention is explained below with the aid of one embodiment and the related drawings.

Figure 1B:
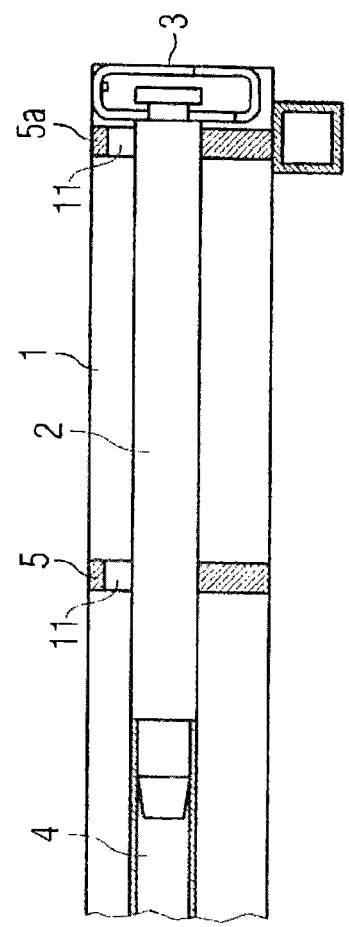

FIG. 1A is a perspective view and FIG. 1B is a partial cross-sectional view of the construction of the transport device according to an advantageous embodiment of the invention; and FIGS. 2 to 10 depict a plurality of different phases of the method according to the invention, according to a preferred embodiment of the method.

The drawings in FIGS. 2 to 10 depict half sections of the right side of the transport device according to the invention and the loading and unloading device according to the invention, as seen in the direction of transport.

DETAILED DESCRIPTION

As evident from FIGS. 1A and 1B, the transport device of the advantageous embodiment comprises longitudinal bars 1, transverse bars 5 and 5a, retainer bars 3 and holding elements, which are rotatably mounted in the retainer bars 3 and which are configured as substrate holding inserts 2 in the embodiment. The longitudinal bars 1 and the transverse bars 5 and 5a form a rectangular frame. The inserts 2 are connected to the ends of the elongated substrates 4, so that they, too, are rotatably mounted. The transverse bars 5 and 5a exhibit openings 11, in which the inserts 2 are mounted. In order to connect the retainer bar 3 to the frame, the retainer bar 3 and the two longitudinal bars 1 exhibit complementary connecting means 10, which make possible the releasable conjoining orthogonal to the plane of the frame. To rotate the inserts 2, a drive mechanism employing a drivable cable 12 in frictional contact with inserts 2 and driven by a drive roller 12a, may be employed.

The following drawings in FIGS. 2 to 10 show the sequence of steps in which a first batch of substrates 4 is removed and then a second batch of substrates 4 is received.

Figure 2:
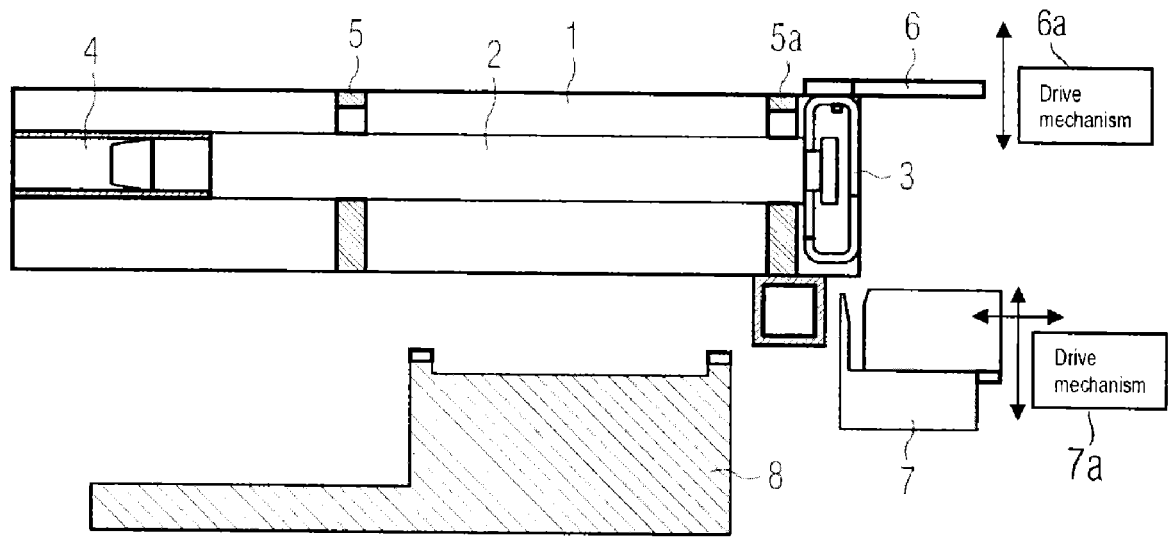

First, as shown in FIG. 2, the transport device according to the invention is moved into the inventive loading and unloading device, or the loading and unloading device is moved to the transport device. This loading and unloading device comprises a holding down device 6 moveable in a direction normal to the plane of frame 1 by a suitable drive mechanism 6a, an operator fork 7 moveable in a plane formed by the frame 1 and/or in a direction normal to the plane by a suitable drive mechanism 7a, and a lifting device 8.

Figure 3:
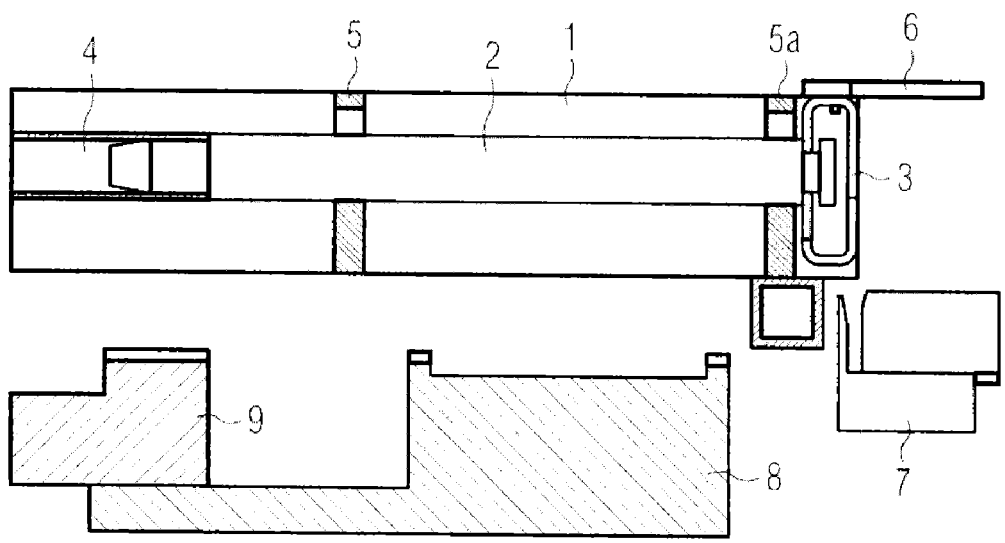

Furthermore, the loading and unloading device according to the invention comprises, as shown in FIG. 3, a storage device (tray) 9. The empty storage device 9 is moved into the loading and unloading device and deposited on the lifting device 8.

Figure 4:
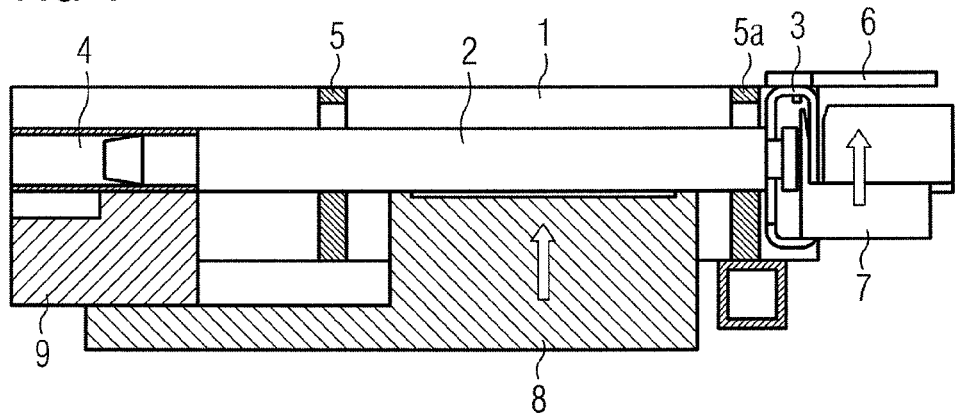

FIG. 4 shows how the lifting device 8 executes together with the storage device 9 and the operator fork 7 an upward movement, whereas the holding down device 6 remains in its position. The operator fork 7 reaches into an opening of the retainer bar 3, said opening being provided for said operator fork.

Figure 5:
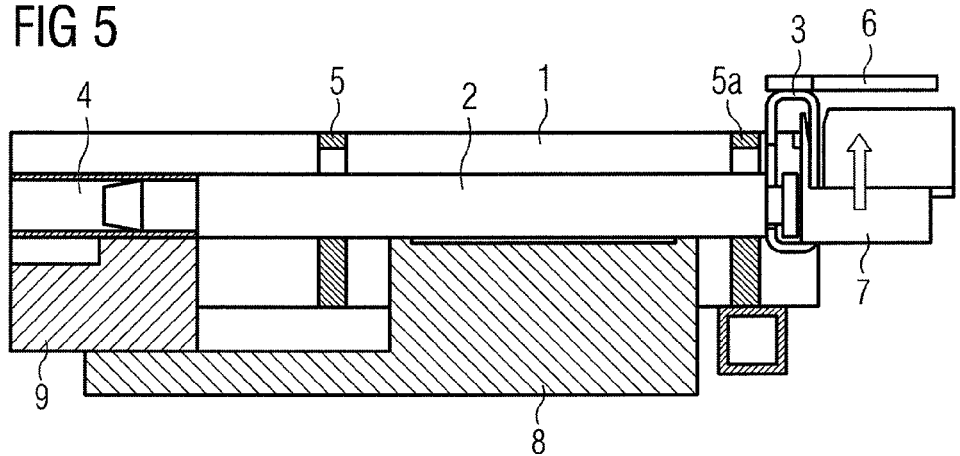
Figure 6:
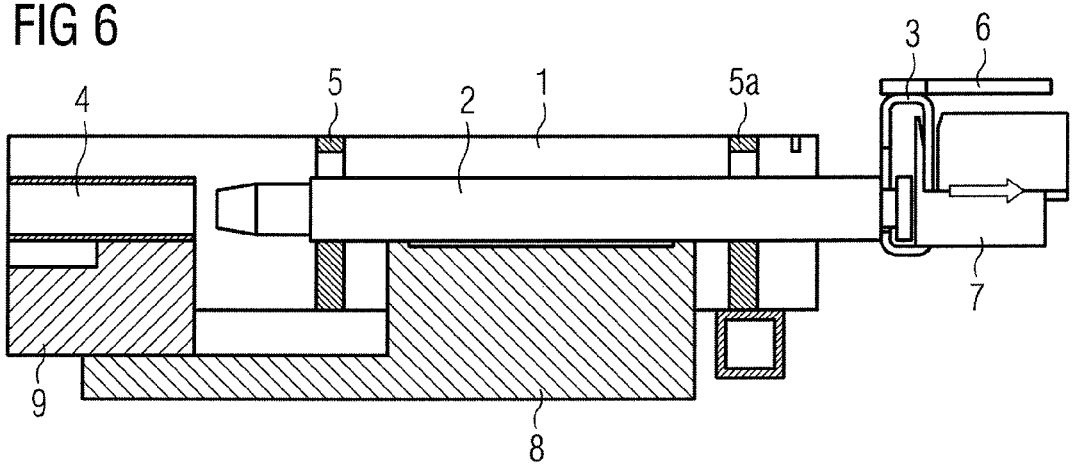
Figure 7:
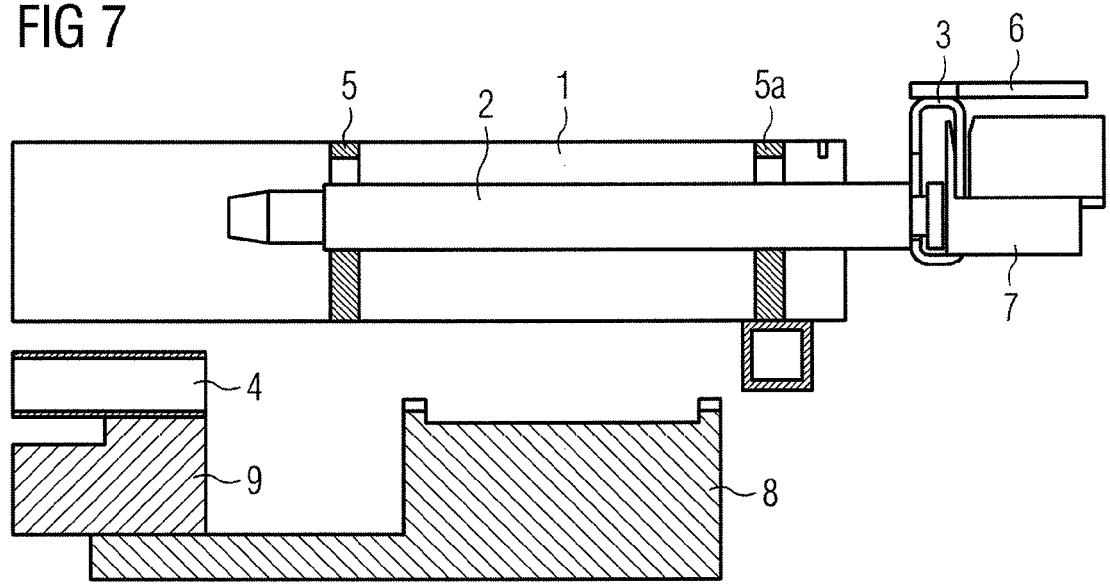
Figure 8:
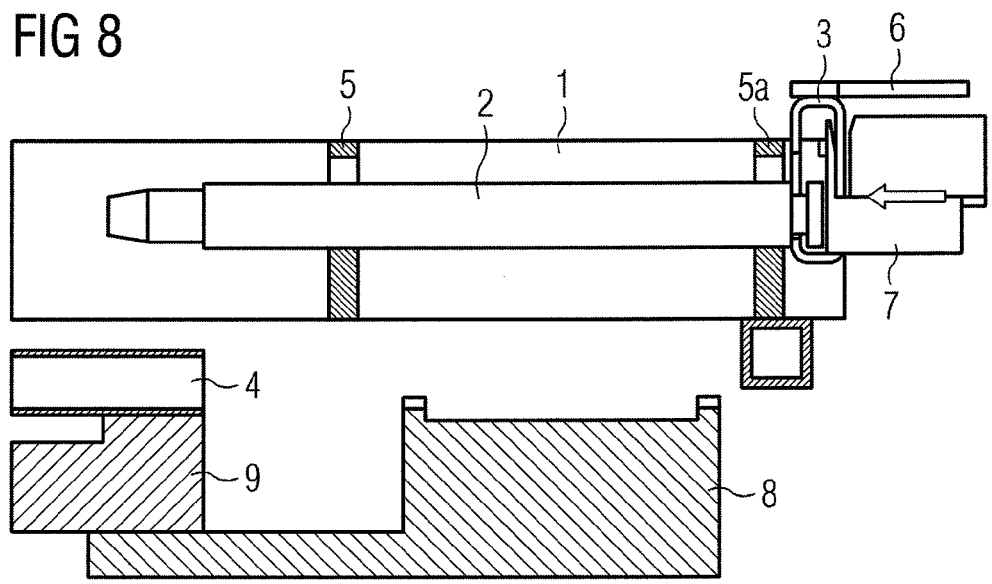

After the operator fork 7 has reached into the opening of the retainer bar 3, the operator fork 7 and the holding down device 6 move upwards, in order to release, as shown in FIG. 5, the connection between the retainer bar 3 and the frame 1, 5, 5a.

Then (FIG. 6) the operator fork 7 and the holding down device 6 move together outwards in the direction of the longitudinal bar 1, thus releasing the connection between the inserts 2 and the substrates 4. In so doing, the free ends of the inserts 2 are supported by the lifting device 8 and the substrates 4 are supported by the storage device 9.

In the next step (FIG. 7) the lifting device 8 and with it the storage device 9, which is lying on said lifting device and which has the substrates 4, is lowered.

Then (FIG. 8) the operator fork 7, the holding down device 6 and with them the retainer bar 3 and the inserts 2, which are attached to said retainer bar, are moved again inwards.

FIG. 9 shows that, following completion of the inward movement, the operator fork 7, the holding down device 6 and with them the retainer bar 3 and the inserts 2, which are attached to said retainer bar, are lowered. In so doing, the retainer bar 3 is connected to the frame 1, 5, 5a.

As soon as the connection between the retainer bar 3 and the frame 1, 5, 5a is produced, the operator fork 7 is lowered further without the holding down device 6 until said operator fork no longer has any connection with the transport device (FIG. 10). The storage device 9 is removed from the region below the transport device so that the coated substrates 4 are accessible. Then the now empty transport device may be populated with new substrates 4.

In the figures the design features of the transport device and the loading and unloading device are extremely simplified and schematized. In a real vacuum coating system, two loading and unloading devices, which are identical in construction, are arranged expediently. In particular, a first loading and unloading device is arranged at the beginning of the vacuum coating system, in order to charge the system with substrates which are to be coated; and a second loading and unloading device is arranged at the end of the vacuum coating system, in order to be able to remove the coated substrates from the system. Both loading and unloading devices exhibit an identical construction. The loading process takes place in the reverse order of sequence to the above-described unloading process.

LIST OF REFERENCE NUMERALS 1 longitudinal bar
2 holding element, insert
3 retainer bar
4 substrate
5 transverse bar
5a transverse bar
6 holding down device
7 operator fork
8 lifting device
9 storage device, tray
10 connecting means
11 opening

The invention claimed is:

1. Method for loading and unloading a transport device for transporting elongated substrates having opposite ends through a vacuum coating system, comprising an essentially rectangular frame, a first group and a second group of substrate holding inserts, rotatably mounted, respectively, on opposite sides of the frame in such a manner that a pair of opposite substrate holding inserts can be connected to the opposite ends of a substrate, and, a first retainer bar operatively connected to the first group of inserts in such a manner that the inserts of the first group are moveable in order to selectively increase or decrease their distance from the inserts of the second group, comprising the steps of:

releasing a connection between the first retainer bar and the frame, moving the first retainer bar and the first group of inserts that are connected to said first retainer bar, in order to increase the distance from the second group of inserts, until the inserts of the first group are released from the elongated substrates, removing the elongated substrates from the transport device, inserting a new batch of elongated substrates into the transport device, moving the first retainer bar and the first group of inserts that are connected to said first retainer bar, in order to decrease the distance from the second group of inserts, until the inserts of the first group are connected with the new batch of elongated substrates, and producing a connection between the first retainer bar and the frame.

2. Method as claimed in claim 1, wherein the connection between the first retainer bar and the frame is released by moving the first retainer bar in a direction normal to a plane formed by the frame.

3. Method as claimed in claim 1, wherein prior to moving the first retainer bar in order to increase the distance from the second group of inserts, a storage device is moved into a position below the frame.

4. Method as claimed in claim 3, further comprising lifting the storage device, so that the substrates are received directly and do not fall onto the storage device.

5. Method as claimed in claim 3, wherein the substrates are moved by lowering the storage device and removing the storage device from below the frame.

* * * * *

UNITED STATES PATENT AND TRADEMARK OFFICE
CERTIFICATE OF CORRECTION

| | | |
|---|---|---|
| PATENT NO. | : 8,033,781 B2 | Page 1 of 1 |
| APPLICATION NO. | : 12/730683 | |
| DATED | : October 11, 2011 | |
| INVENTOR(S) | : Johannes Struempfel | |

It is certified that error appears in the above-identified patent and that said Letters Patent is hereby corrected as shown below:

Title Page, Item (75)

In the Inventors (75): Delete "Andrewas" and insert --Andreas--

Signed and Sealed this

Twentieth Day of December, 2011

David J. Kappos
*Director of the United States Patent and Trademark Office*